(12) United States Patent
Konstad (10) Patent No.: US 6,452,797 B1
(45) Date of Patent: *Sep. 17, 2002

(54) FAN-COOLED CARD (75) Inventor: Rolf A. Konstad, Gold River, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/968,399

(22) Filed: Nov. 12, 1997

(51) Int. Cl.[7] ................................................ H05K 7/20
(52) U.S. Cl. ...................... 361/695; 165/80.3; 361/687; 454/184
(58) Field of Search .............................. 312/223.1, 236; 415/177, 178, 213.1, 214.1; 165/80.3, 122–126; 454/184; 361/687, 690, 694, 695, 697, 717–719, 725

(56) References Cited

U.S. PATENT DOCUMENTS

| 4,126,269 A | * | 11/1978 | Bruges | 361/695 |
|---|---|---|---|---|
| 4,417,295 A | * | 11/1983 | Stuckert | 361/694 |
| 4,449,164 A | * | 5/1984 | Carlson | 361/694 |
| 4,730,233 A | * | 3/1988 | Osterman | 361/725 |
| 5,446,619 A | * | 8/1995 | Madsen | 361/695 |
| 5,630,469 A | * | 5/1997 | Butterbaugh | 361/699 |
| 5,644,472 A | * | 7/1997 | Klein | 361/695 |
| 5,694,294 A | * | 12/1997 | Ohashi | 361/687 |
| 5,721,670 A | * | 2/1998 | Cochrane | 361/695 |
| 5,725,622 A | * | 3/1998 | Whitson | 361/695 |
| 5,828,549 A | * | 10/1998 | Gandre | |
| 5,963,424 A | * | 10/1999 | Hileman | |

* cited by examiner

Primary Examiner—Gerald Tolin
(74) Attorney, Agent, or Firm—Kenyon & Kenyon (57) ABSTRACT To manage heat generated by an electric circuit, a fan is provided to generate an air flow through a ducting structure over the electric circuit. For example, in a graphics accelerator card, a fan is placed in a void in the card and a ducting structure is placed over the fan and the graphics controller IC chip of the card. Air flow generated by the fan travels over the IC chip via the ducting structure to reduce the ambient temperature around the IC chip. The height of the ducting structure from a surface of the graphics accelerator card may be made sufficiently small so as to satisfy height requirements set forth in specifications such as the Peripheral Component Interconnect (PCI) and Accelerated Graphics Port (AGP) specifications.

21 Claims, 7 Drawing Sheets

FAN-COOLED CARD

BACKGROUND OF THE INVENTION

1. Field of the Invention

The present invention pertains to an apparatus for managing heat generated by an electric circuit, such as in a computer environment or the like. More particularly, the present invention pertains to an apparatus for cooling components on a computer add-in card or the like.

2. Related Art

Electric and electronic circuits, particularly integrated circuit (IC) chips, tend to generate an appreciable amount of heat during operation. If the heat is not sufficiently removed from the ambient area surrounding the IC chip, the electronic circuit therein may not operate properly. There are several available options for cooling electric and electronic circuits. One such method is to provide a fan which creates an air flow over the circuits. The air flow typically has a temperature cooler than the ambient air near the electric circuit which leads to a reduction in temperature.

In a computer environment (e.g., a personal computer or workstation), a fan is typically placed at the front or rear of the computer so that cooler air from outside the chassis of the computer may be brought in to the circuits on the main circuit board (also referred to as a motherboard). In some computer chassis, one or more paths may be provided which draw the air flow from the front or rear of the computer to other areas inside the chassis.

Methods for cooling an electric circuit (e.g., an electronic circuit in an integrated circuit (IC) chip such as Pentium® processor, manufactured by Intel Corporation, Santa Clara, Calif.) are described in Application Note AP-480 "Pentium® Processor Thermal Design Guidelines Rev. 2.0," November 1995 (see, e.g., *Pentium® and Pentium® Pro Processors and Related Products*, 1996, pp. 2-1337 to 2-1363, a copy of which may be obtained from McGraw-Hill Book Company). These methods include the placement of a heat sink on top of the IC chip and increasing air flow over the processor so that the ambient air (heated by the IC chip) may be removed.

Another device for removing heat from an electric circuit, such as an IC chip, is a heat pipe. A heat pipe typically has a round cross-section including two paths extending the length of the pipe. The heat pipe (e.g., an end of the heat pipe) is placed proximately to a component, such as a processor. Working fluid in the heat pipe (e.g., water) is heated at the component and vaporized. The vapor travels away from the component in a hollow, first path of the heat pipe (this first path typically has a relatively large cross-sectional area). Eventually, the vapor is cooled at another location in the heat pipe. For example, the vapor could be cooled over a heat sink device mentioned above. The vapor condenses to form working fluid and the working fluid travels back to the processor through a second path, sometimes referred to as a wick structure, via capillary action. Thus, the heat pipe continuously circulates working fluid and vapor to remove heat from the processor. Further details on the operation of heat pipes may be found in *Handbook of Applied Thermal Design* (1989, ed., Eric C. Guyer, pp. 7-50 to 7-58).

Yet another example of a device for reducing heat in a computer system is a fan card. A fan card is a computer add-in card that is inserted into a bus connector slot in the motherboard. The fan card includes one or more fans that typical create an air flow in a direction perpendicular to a surface of the card.

Figure 1:
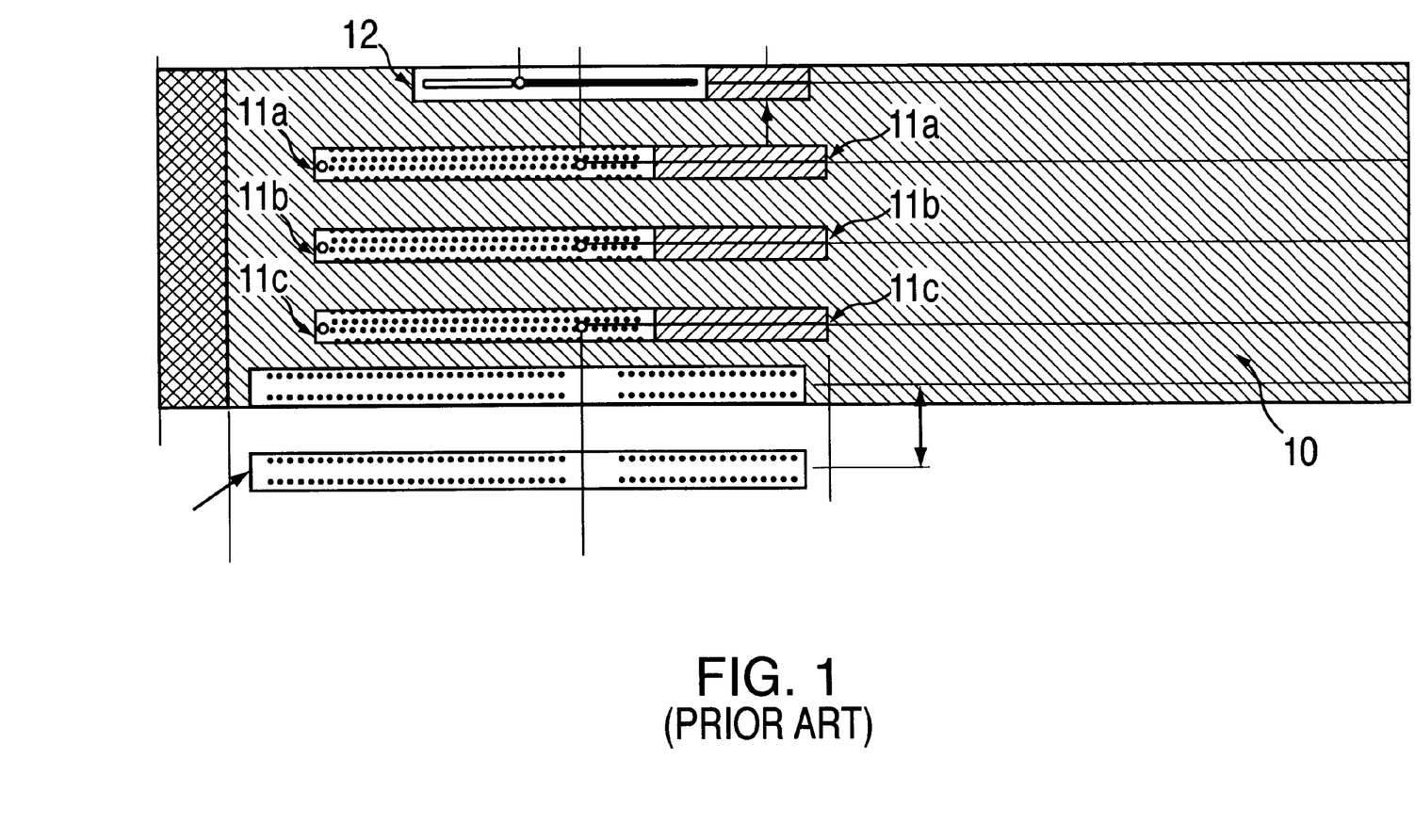
FIG. 1 is a view of an exemplary motherboard in a computer system as known in the art.

A drawback of the aforementioned techniques for managing heat is that they may not work effectively when there are space restrictions. As an example, the Accelerated Graphics Port (AGP) Interface Specification (Rev. 1.0, Intel Corporation, Jul. 31, 1996) and Peripheral Component Interconnect (PCI) Specification (Rev. 2.1, PCI Special Interest Group, Hillsboro, Oreg., 1995) limit the physical dimensions of add-in cards. Referring to FIG. 1, a motherboard 10 in an exemplary computer system is shown. Motherboard 10 includes three PCI connector slots 11a–c for insertion of cards constructed and operating according to the PCI Specification and an AGP connector slot 12 for insertion of a card, such as a graphics accelerator card, constructed and operating according to the AGP specification. A card placed in the AGP connector slot 12 will be relatively close to a card placed in the PCI connector slot 11a. The AGP and PCI specification limit the thickness of the card placed in AGP connector slot 12 to 0.105 inches on the "back" side (i.e., the side facing away from the PCI connector slot 11a) and 0.580 inches on the "front" side (i.e., the side facing toward PCI connector slot 11a).

With these thickness limitations, the space between the card in PCI connector slot 11a and AGP connector 12 is very limited, making it difficult to cool electric circuits (such as IC chips) on the AGP card. For example, a standard manner for cooling an IC chip is to mount a heat-sink and a cooling fan onto the surface of the IC chip facing away from the card. The combined thickness of the IC chip, heat-sink and fan may exceed the 0.580 inch maximum for the AGP card. Also, even if the combined thickness of these components is less than 0.580 inches, there may be insufficient space between the fan and the card in PCI slot 11a to allow sufficient air flow away from the IC chip, thus impeding the cooling process.

Though smaller versions of the heat-sink and fan may be provided to cool an IC chip, there are several disadvantages in doing so. First, smaller fans generate more noise than larger fans because they need to spin faster to generate the same amount of air flow. Also, because they operate at faster speeds, smaller fans are less reliable (i.e. smaller fans have shorter life spans).

There are also disadvantages in using a heat pipe to remove heat from an IC chip. In an AGP card, the graphical controller IC chip may reach a temperature of 100° C. which is passed to the heat pipe making the heat pipe hot, as well. Other devices near the heat pipe may become damaged, such as ribbon cables in the computer system, which may melt at about 80° C. The heat pipe is also particularly heavy and may cause a shock or vibration problem (i.e., when the computer chassis is vibrated, the AGP card coupled to the heat pipe may be dislodged from the AGP connector slot 12).

Accordingly, there is a need for an apparatus that improves the removal of heat from an electric circuit such as an IC chip.

SUMMARY OF THE INVENTION

An apparatus to cool an electric circuit according to an embodiment of the present invention includes a fan coupled to a ducting structure. The ducting structure is coupled to the fan and is adapted to generate an air flow in the ducting structure over an electric circuit. The ducting structure is adapted to be coupled to a card (for example, a computer add-in card).

DETAILED DESCRIPTION

Figure 2:
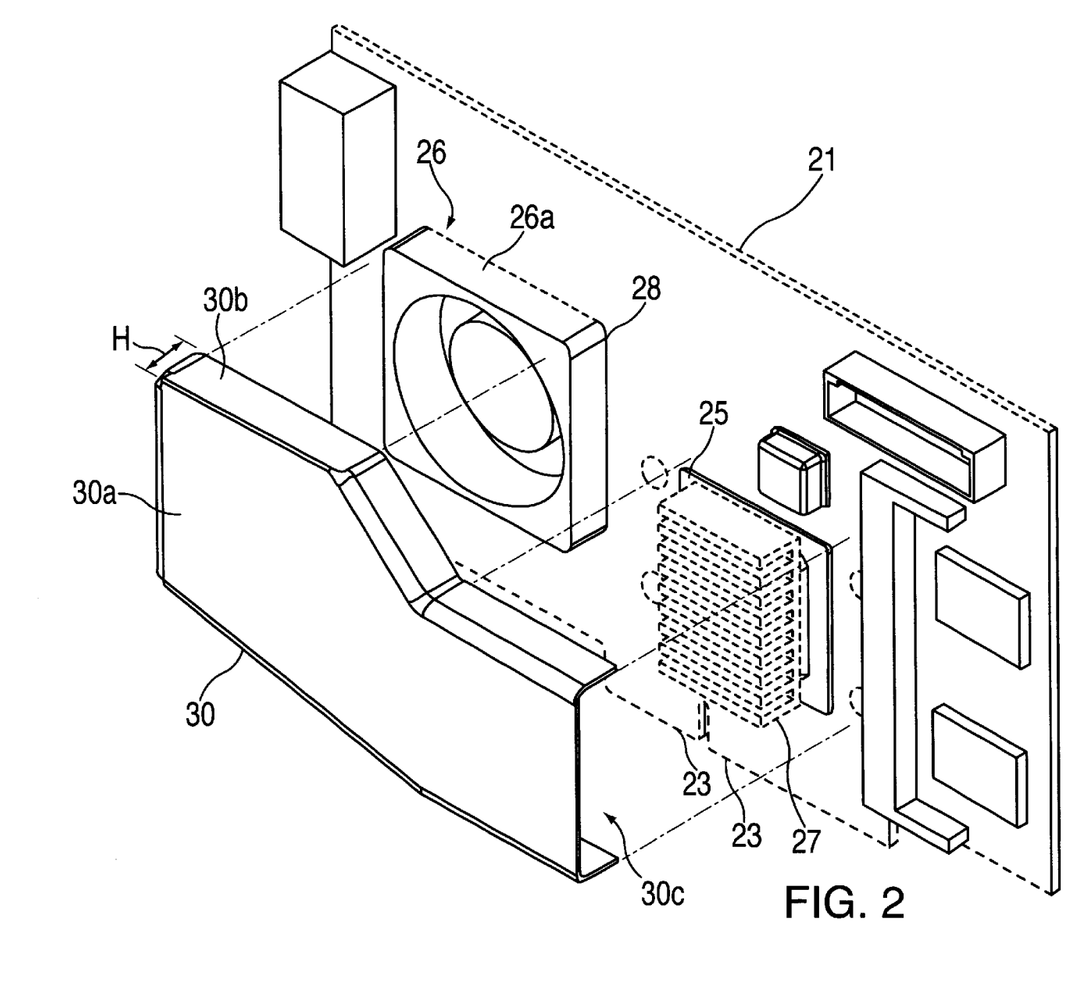
FIG. 2 is a perspective view of a card having an electric circuit and including a cooling system constructed according to an embodiment of the present invention.

Referring to FIG. 2, a card including one or more electric circuits is shown. In this example, card 21 is a graphics card operating according to the AGP specification. One skilled in the art will appreciate that card 21 can be any of a variety of structures for holding electric circuits such as add-in cards, printed circuit boards, motherboards, etc. Graphics card 21 includes connectors 23 that may be inserted into AGP connector slot 12 (see FIG. 1). Graphics card 21 also includes an electric circuit (i.e., in this example, a graphics controller IC chip 25) having a first side coupled to card 21. An optional heat sink device 27 is mounted on an opposing side of IC chip 25 facing away from card 21. A fan 26 is provided having a shroud 26a which is inserted into a void in card 21. In this example, the shroud is made using an injection molded plastic procedure. A ducting structure 30 is provided having a planar portion 30a and a side wall 30b that may extend around the periphery of planar portion 30a and leave an opening 30c. Ducting structure 30 is coupled to card 21 as indicated by dashed lines. In this embodiment, ducting structure 30 has a planar configuration, however, the present invention encompasses a variety of configurations. For example, ducting structure 30 may have different shapes, portion 30a and walls 30b may be rounded, etc. Also, ducting structure 30 may include baffles or other such structures to further direct air flow onto electric circuit 25.

Figure 3:
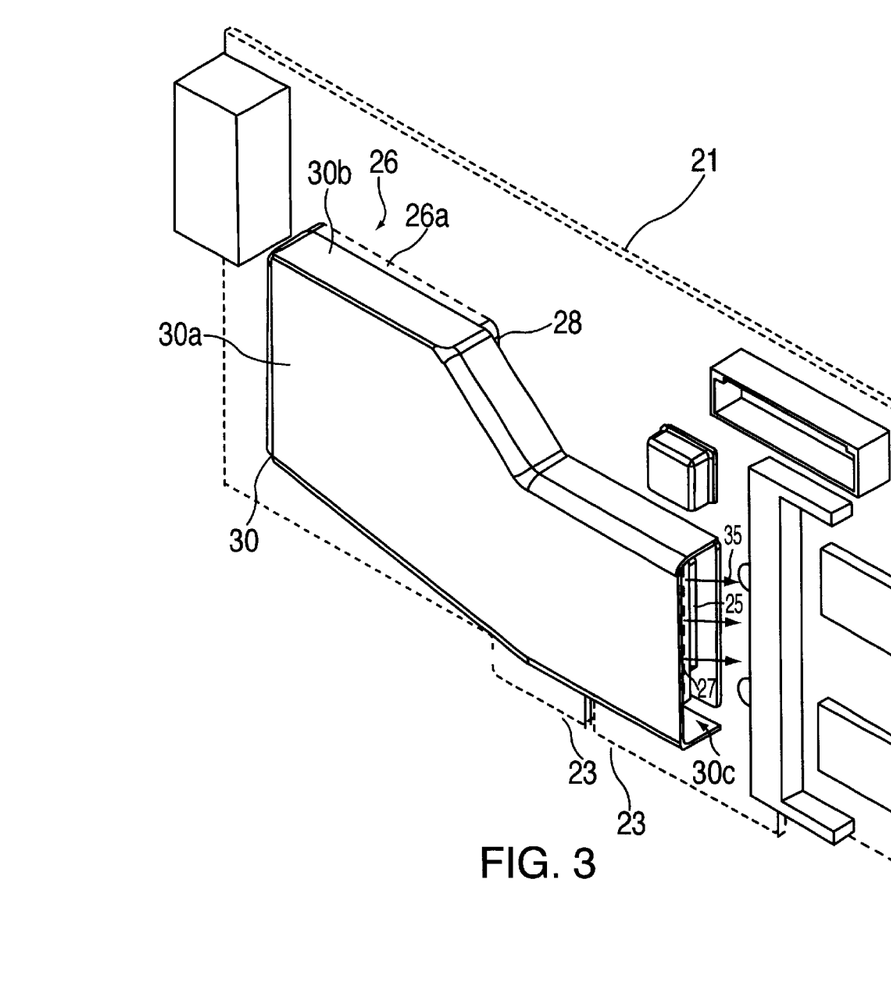
FIG. 3 is a perspective view of the card of FIG. 2 with a ducting structure coupled to the card.

Referring to FIG. 3, the coupling of ducting structure 30 to card 21 is shown. Ducting structure 30 is placed over fan 26 and forms a duct 35 indicated by arrows. Optionally, ducting structure 30 may be directly coupled to the heat sink and may hold the heat sink on top of electric circuit 25. An air flow generated by fan 26 can flow perpendicular to card 21 and through duct 35 and over electric circuit 25 and optional heat sink 27. Thus, ducting structure 30 redirects the air flow from fan 26 so that it runs parallel to the surface of card 21. In the example of FIG. 3, ducting structure 30 is coupled over electric circuit 25, but one skilled in the art will appreciate that ducting structure 30 may be shorter so that it does not cover electric circuit 25 or longer so that is extends beyond electric circuit 25. Also, ducting structure 30 can be wider than electric circuit 25 to utilize the surface of card 21 for its heat sink properties. In this example, ducting structure 30 is coupled to board 21 via an interference fit between side wall 30b of the ducting structure and shroud 26a of fan 26. Instead of creating duct 35 between ducting structure 30 and a surface of card 21, ducting structure 30, itself, can include an additional wall to form duct 35.

Figure 4:
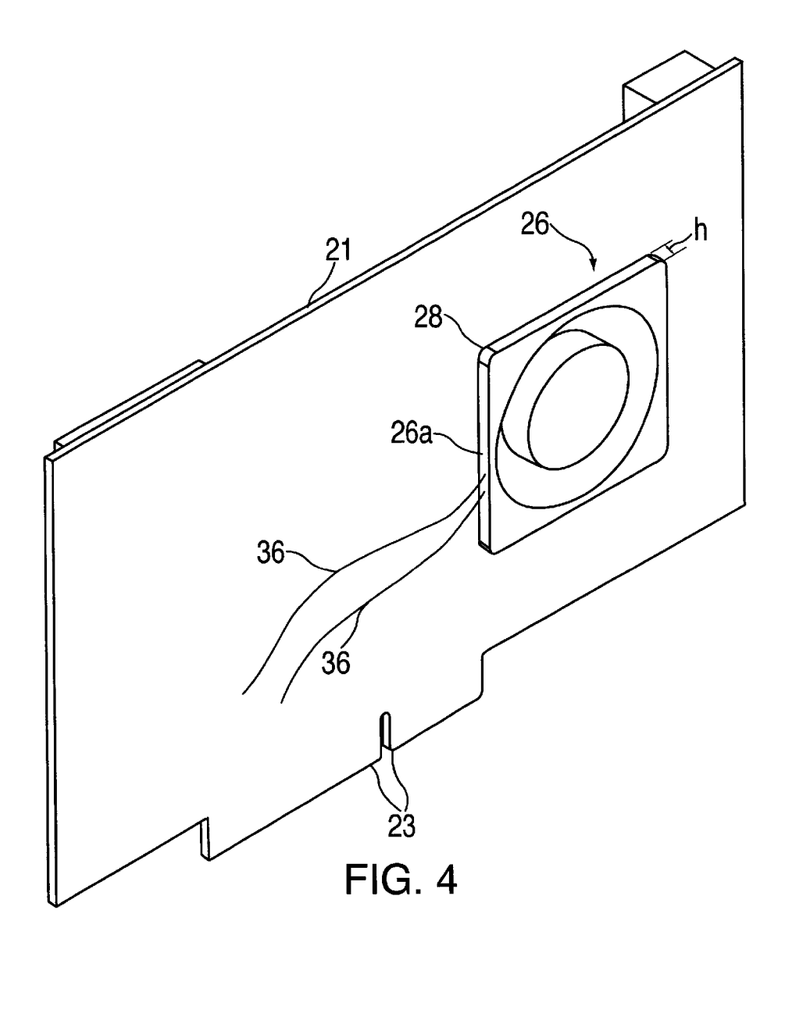
FIG. 4 is a perspective view of an opposing side of the cards of FIGS. 2–3.

Referring to FIG. 4, a view of the opposing side of card 21 of FIGS. 2 and 3 is shown. Shroud 26a of fan 26 extends a height, h, beyond the surface of card 21 through void 28 and draws air into duct 35 created between ducting structure 30 and card 21 (as shown in FIG. 3). One skilled in the art will appreciate that fan 26 can also draw air from duct 35 in an opposite direction. Conductors 36 (e.g., wires) may be provided coupled to fan 26 which may be coupled to a voltage supply and ground on motherboard 10 (FIG. 1), for example. Advantageously, the height, h, of the fan extends less than 0.105" from the surface of card 21 as required by the AGP specification. Also the height, H, of ducting structure 30 (FIG. 2) is advantageously less than 0.580" from the surface of card 21 as required by the AGP specification.

Figure 5:
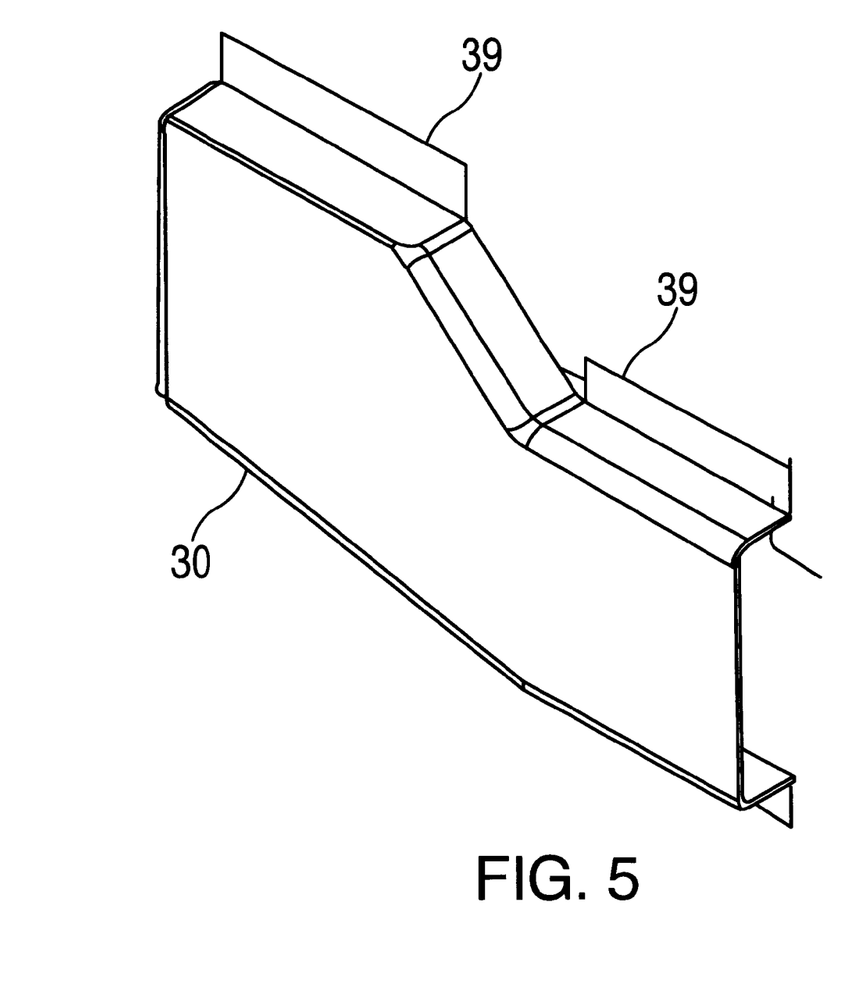
FIG. 5 is a perspective view of ducting structure including flanges for attachment to the card of FIGS. 2–4.

One skilled in the art will appreciate that many alternatives of the structure of FIGS. 2–4 may be made within the scope of the present invention. In card 21 of FIGS. 2–4, fan shroud 26a is coupled to card 21 via an interference fit in void 28. Alternatively, fan shroud 26a may include flanges that are attached to card 21 with a fastening device such as screws, clasps, adhesive or the like. Likewise, ducting structure 30 may include flanges 39 (as shown in FIG. 5) that may be attached to card 21 with a fastening device such as screws, clasps, adhesive or the like.

Figure 6:
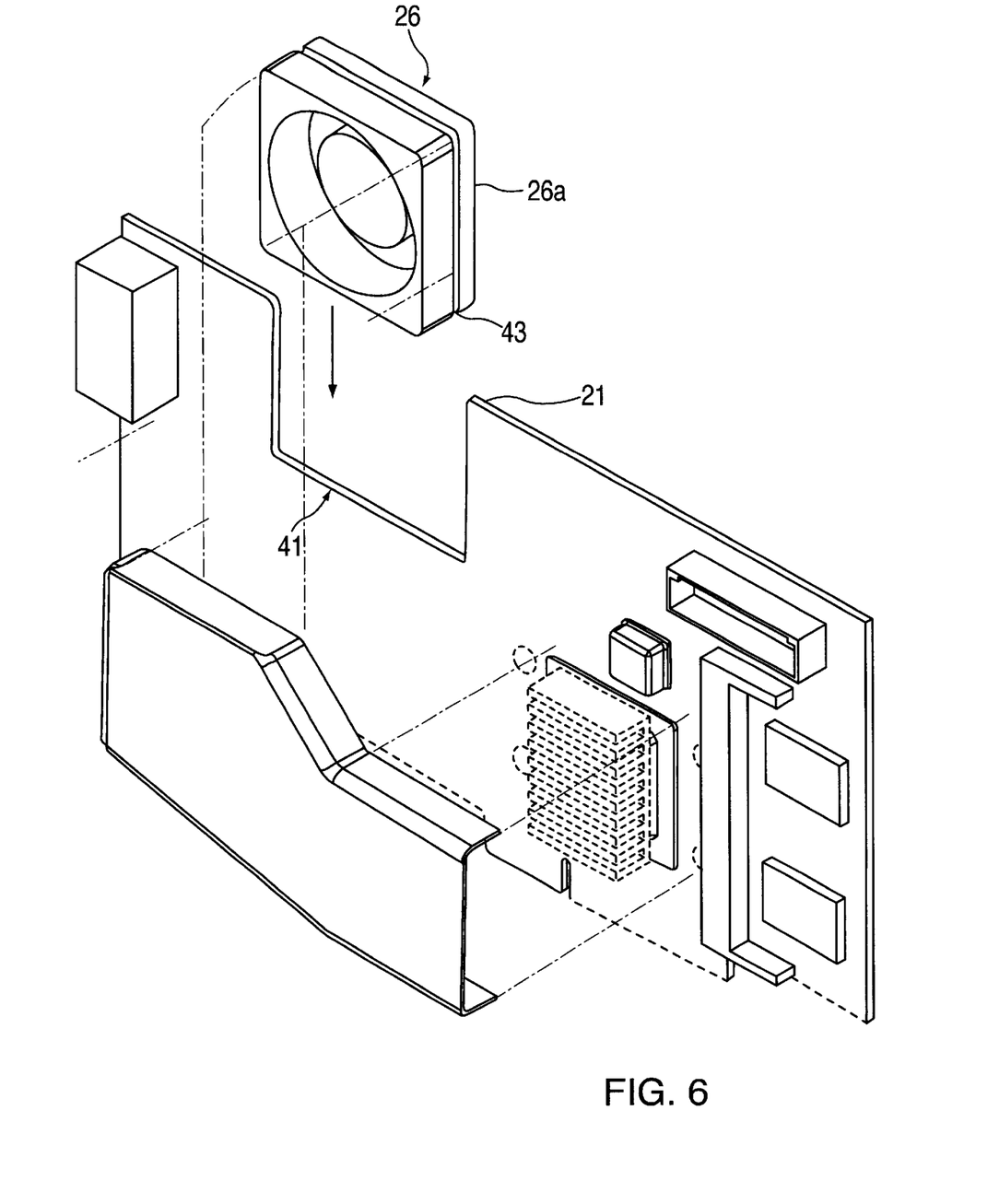
FIG. 6 is a perspective view of an alternative embodiment of the card of FIGS. 2–4.

As shown in FIG. 6, fan shroud 26a may include a groove 43 which mates with a slot 41 in card 21. Alternatively, fan 26 may be coupled to the top of card 21. At least for the situation where card 21 is a so-called "half-high" card (i.e., a card that extends a smaller distance from a motherboard than a typical add-in card), the combined height of card 21 and fan 26 may meet the height requirements in the PCI and/or AGP specifications.

Figure 7A:
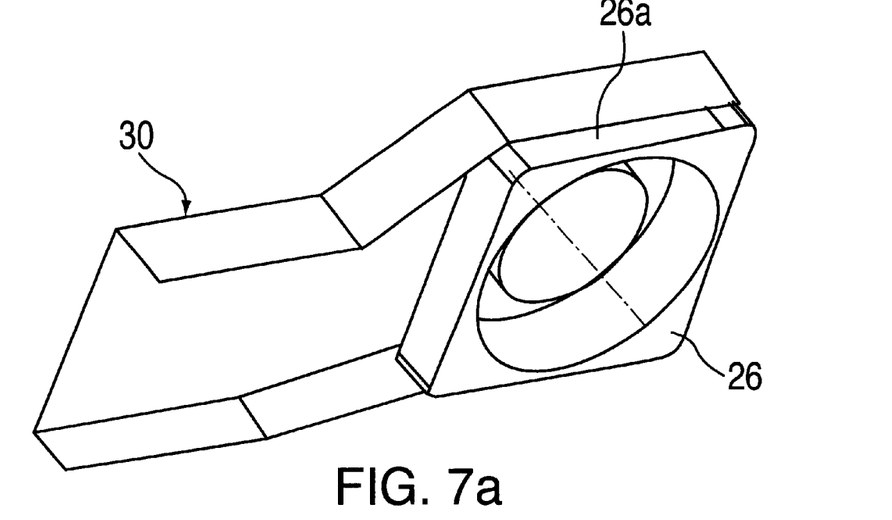
FIGS. 7a and 7b are perspective views of an integrated ducting structure/fan assembly and an integrated ducting structure/fan/IC chip assembly, respectively.
Figure 7B:
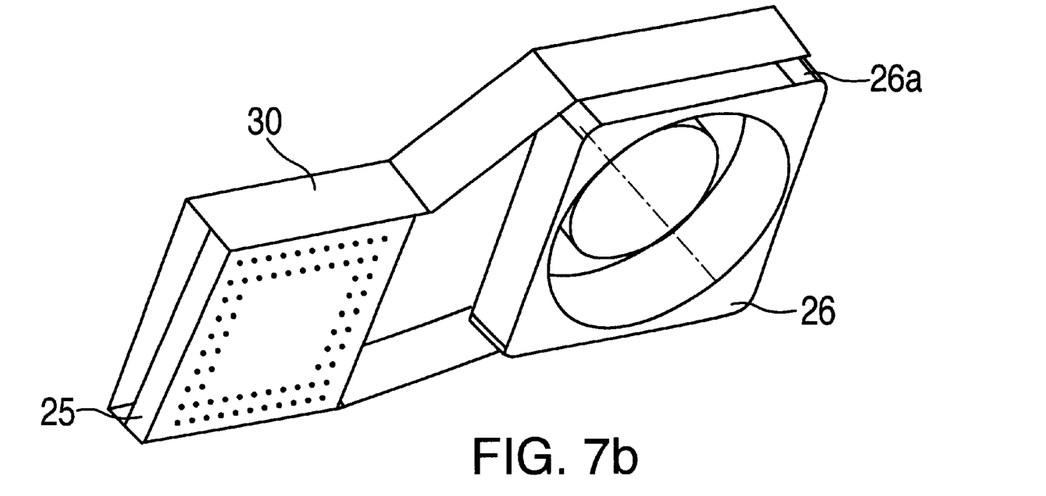

As shown in the embodiment of FIG. 7a, ducting structure 30 and fan 26 may be integrated as a single unit which may then be coupled to card 21 (not shown in FIG. 7a). In this embodiment, fan shroud 26a is molded to ducting structure 30, however any of a variety of other known methods may be used to couple fan 26 to ducting structure 30 prior to coupling the integrated unit to card 21 (e.g., an interference fit, screws, clasps, adhesive, etc.). Alternatively, as shown in the embodiment of FIG. 7b, ducting structure 30, fan 26, and an electric circuit (i.e., in this example, graphics controller IC chip 25 of FIG. 2) are integrated as a single unit. Again, fan 26 and IC chip 25 are coupled to ducting structure 30 using any of a variety of known methods such as the ones set forth above.

Using the duct system of the present invention, air flow from a fan or the like can be redirected by a ducting structure so that an electric circuit, such as an IC chip operating at 10 Watts may be effectively, and efficiently, cooled to a proper operating temperature. Also, using the duct system of the present invention, larger fans operating at lower, quieter speeds can be used to cool an electric circuit. Although several embodiments are specifically illustrated and described herein, it will be appreciated that modifications and variations of the present invention are covered by the above teachings and within the purview of the appended claims without departing from the spirit and intended scope of the invention. For example, the present invention may be used to cool electric circuits in areas other than in a card in a computer system, such as the computer motherboard or electric circuits in other devices, such as peripheral devices, testing equipment, etc.

What is claimed is:

1. A system including at least one electric circuit comprising:

a card;

an electric circuit on said card;

a fan attached to said card; and a ducting structure coupled to said card and over said fan,         where said fan is adapted to generate an air flow from one side of said card to another side of said card in said ducting structure directing the air flow over said electric circuit.

2. The system of claim 1 wherein said ducting structure is coupled over said electric circuit.

3. The system of claim 2 wherein said ducting structure has a height, H, from a surface of said card less than 0.580 inches.

4. The system of claim 1 wherein said fan is positioned in a void in said card.

5. The system of claim 1 wherein said electrical circuit is an integrated circuit chip.

6. The system of claim 5 wherein said integrated circuit chip has a first side coupled to said card and an opposing side facing away from said card, the card further comprising:
   a heat sink coupled to the opposing side of said integrated circuit chip.

7. The system of claim 5 wherein said integrated circuit chip is a graphics controller integrated circuit chip.

8. The system of claim 7 wherein said ducting structure has a height, H, from a surface of said card less than 0.580 inches.

9. The system of claim 1 wherein said fan includes a fan shroud having a groove and said card is provided with a slot such that the groove of said fan shroud mates with the slot of said card.

10. A system including at least one electric circuit comprising:
   a card;
   a fan attached to said card and adapted to generate an air flow perpendicular to said card; and
   a ducting structure coupled to said card and over said fan, where said ducting structure is adapted to direct the air flow from said fan over said electric circuit and parallel to said.

11. The system of claim 10 wherein said ducting structure is coupled over said electric circuit.

12. The system of claim 11 wherein said ducting structure has a height, H, from a surface of said card less than 0.580 inches.

13. The system of claim 10 wherein said fan is positioned in a void in said card.

14. The system of claim 10 wherein said electrical circuit is an integrated circuit chip.

15. The system of claim 14 wherein said integrated circuit chip has a first side coupled to said card and an opposing side facing away from said card, the card further comprising:
   a heat sink coupled to the opposing side of said integrated circuit chip.

16. The system of claim 14 wherein said integrated circuit chip is a graphics controller integrated circuit chip.

17. The system of claim 16 wherein said ducting structure has a height, H, from a surface of said card less than 0.580 inches.

18. The system of claim 10 wherein said fan includes a fan shroud having a groove and said card is provided with a slot such that the groove of said fan shroud mates with the slot of said card.

19. A method of cooling an electric circuit comprising:
   generating an air flow with a fan attached to a card, said air flow being perpendicular to said card; and
   directing the air flow from said fan via a ducting structure over an electric circuit and said fan so that said air flow is parallel to said card.

20. The method of claim 19 wherein said fan is coupled in a void in a card and said ducting structure and electric circuit are coupled to said card.

21. The method of claim 20 wherein said ducting structure is coupled over said electric circuit.

* * * * *

UNITED STATES PATENT AND TRADEMARK OFFICE
CERTIFICATE OF CORRECTION

PATENT NO.    : 6,452,797 B1
DATED         : September 17, 2002
INVENTOR(S)   : Rolf A. Konstad It is certified that error appears in the above-identified patent and that said Letters Patent is hereby corrected as shown below:

<u>Column 5,</u>
Line 36, "… to said." should be -- … to said card. --

Signed and Sealed this

Eighth Day of July, 2003

JAMES E. ROGAN
*Director of the United States Patent and Trademark Office*